(12) United States Patent
Fang

(10) Patent No.: US 9,425,613 B2
(45) Date of Patent: Aug. 23, 2016

(54) CURRENT LIMITING CIRCUIT

(71) Applicant: YOTTACONTROL CO., Kaohsiung (TW)

(72) Inventor: Cheng-Jen Fang, Kaohsiung (TW)

(73) Assignee: Yottacontrol Co., Kaohsiung (TW)

( * ) Notice: Subject to any disclaimer, the term of this patent is extended or adjusted under 35 U.S.C. 154(b) by 79 days.

(21) Appl. No.: 14/564,210

(22) Filed: Dec. 9, 2014

(65) Prior Publication Data

US 2016/0056624 A1    Feb. 25, 2016

(30) Foreign Application Priority Data

Aug. 19, 2014    (CN) .......................... 2014 1 0409002

(51) Int. Cl.
*H02H 9/02*    (2006.01)
*H03K 17/082*    (2006.01)

(52) U.S. Cl.
CPC .......... *H02H 9/025* (2013.01); *H03K 17/0822* (2013.01)

(58) Field of Classification Search
CPC ............... H02H 9/025; H03K 17/082; H03K 17/0822; H03K 17/122

USPC ......................................................... 361/93.9
See application file for complete search history.

(56) References Cited

U.S. PATENT DOCUMENTS

| | | | | |
|---|---|---|---|---|
| 5,554,954 A * | 9/1996 | Takahashi | ............... | G05F 1/565 327/427 |
| 2009/0189584 A1* | 7/2009 | Suzuki | .................... | G05F 1/573 323/284 |
| 2011/0298524 A1* | 12/2011 | Xu | ......................... | H02M 3/156 327/432 |
| 2013/0293986 A1* | 11/2013 | Lerner | .................... | G05F 1/573 361/18 |
| 2014/0239713 A1* | 8/2014 | Kanzaki | .................... | H02J 1/00 307/11 |

\* cited by examiner

*Primary Examiner* — Stephen W Jackson
*Assistant Examiner* — Christopher Clark
(74) *Attorney, Agent, or Firm* — Rosenberg, Klein & Lee

(57) ABSTRACT

A current limiting circuit is electronically connected between a power source and a load, and comprises a MOSFET having a drain, a gate, and a source, a first operational amplifier, a voltage-limiting circuit, and a first transistor having an emitter, a base, and a collector. The drain is connected to the power source, the source is connected to the load and is grounded, and the gate is connected to the voltage-limiting circuit. The emitter is connected to the voltage-limiting circuit, the base is connected to the first operational amplifier, and the collector is grounded. The first operational amplifier detects an output voltage of the load to control a drain current of the MOSFET for protecting the MOSFET from being overloaded, and the current limiting circuit has no current limiting resistor, such that power consumption is reduced.

2 Claims, 3 Drawing Sheets

CURRENT LIMITING CIRCUIT

BACKGROUND OF THE INVENTION

1. Field of the Invention

The present invention relates to a current limiting circuit, and especially relates to a current limiting circuit having a metal-oxide-semiconductor filed-effect transistor (MOSFET) for reducing power loss.

2. Description of the Related Art

With reference to FIG. 3, a conventional current limiting circuit has an input positive terminal I/P4, an input negative terminal I/P5, an output positive terminal O/P4, an output negative terminal O/P5, a MOSFET Q4, a current limiting resistor $R_{limit}$, an error amplifier 50, and a PNP common collector amplifier 60. A drain of the MOSFET Q4 is electronically connected to the input positive terminal I/P4, a source of the MOSFET Q4 is electronically connected through the current limiting resistor $R_{limit}$ to be grounded, and a gate of the MOSFET Q4 is electronically connected to an output terminal O/P6 of the PNP common collector amplifier 60. The error amplifier 50 has a positive input, a negative input, and an output. A voltage dividing circuit 51 is electronically connected between a reference voltage source $V_{ref}$ and the output negative terminal O/P5, and has a first resistor R4 and a second resistor R5. The first resistor R4 and the second resistor R5 are electronically connected in series, and a node between the first resistor R4 and the second resistor R5 is electronically connected to the positive input of the error amplifier 50. The negative input of the error amplifier 50 is grounded, and the output of the error amplifier 50 is electronically connected to an input terminal I/P6 of the PNP common collector amplifier 60. The input negative terminal I/P5 is electronically connected to the output negative terminal O/P5, and the output positive terminal O/P4 is grounded.

When the conventional current limiting circuit is operated, the input positive terminal I/P4 and the input negative terminal I/P5 are connected to a power source 30, and the output positive terminal O/P4 and the output negative terminal O/P5 are connected to a load 40. A drain current of the MOSFET Q4 is controlled by a gate voltage of the MOSFET Q4. The gate voltage of the MOSFET Q4 is an output voltage of the PNP common collector amplifier 60, and an input voltage of the PNP common collector amplifier 60 is an output voltage of the error amplifier 50. The drain current of the MOSFET Q4 flows through the current limiting resistor $R_{limit}$ and the load 40.

When the drain current of the MOSFET Q4 suddenly rises up, a voltage through the current limiting resistor $R_{limit}$ also rises up. One end of the current limiting resistor $R_{limit}$ is grounded, and the other end of the current limiting resistor $R_{limit}$ is electronically connected to the source of the MOSFET Q4. Further, a voltage of the source of the MOSFET Q4 also rises up, but the rising drain current of the MOSFET Q4 does not cause the voltage of the gate of the MOSFET Q4 to rise up. Then, a gate-to-source voltage of the MOSFET Q4 decreases. A maximum of the drain current is limited by the gate-to-source voltage of the MOSFET Q4. When the gate-to-source voltage of the MOSFET Q4 decreases, the maximum of the drain current also decreases. Therefore, the maximum of the drain current of the MOSFET Q4 can be decreased by the current limiting resistor $R_{limit}$. Then the limited drain current of the MOSFET Q4 can protect the MOSFET Q4 from damages when the drain current of the MOSFET Q4 suddenly rises up.

The current limiting resistor $R_{limit}$ is mounted on a power transmission route of the conventional current limiting circuit. When the conventional current limiting circuit is in normal use, the current limiting resistor $R_{limit}$ has the drain current flowing through, and causes power consumption. Therefore, the conventional current limiting circuit needs to be further improved for reducing the power consumption under normal use.

SUMMARY OF THE INVENTION

An objective of the present invention is to provide a current limiting circuit having no current limiting resistor mounted on a power transmission route, and the current limiting circuit can limit a maximum of a drain current of the MOSFET.

To achieve the foregoing objective, the current limiting circuit is mounted between a power source and a load, and has an input positive terminal, an input negative terminal, an output positive terminal, an output negative terminal, a MOSFET, a voltage dividing circuit, a first amplifier, a voltage-limiting circuit, and a first transistor.

The input positive terminal and the input negative terminal are adapted to be electronically connected to the power source, and the output positive terminal and the output negative terminal are adapted to be electronically connected to the load.

The MOSFET has a drain, a source, and a gate. The drain is electronically connected to the input positive terminal, and the source is grounded and electronically connected to the output positive terminal. The input negative terminal is electronically connected to the output negative terminal.

The voltage dividing circuit is electronically connected between a reference voltage source and the output negative terminal, and comprises a first resistor and a second resistor. The first resistor and the second resistor are electronically connected in series. The first operational amplifier comprises a first positive input, a first negative input, and a first output. The first positive input is electronically connected to a node between the first resistor and the second resistor, and the first negative input is grounded.

The voltage-limiting circuit has a fixed-current output, and the fixed-current output is electronically connected to the gate of the MOSFET. The first transistor comprises an emitter, a base, and a collector. The emitter is electronically connected to the gate of the MOSFET, the base is electronically connected to the first output of the first amplifier, and the collector is grounded.

The current limiting circuit limits a maximum voltage of the gate of the MOSFET by the voltage-limiting circuit, and then limits the maximum of the drain current of the MOSFET. The fixed-current output of the voltage-limiting circuit outputs a fixed current to the emitter of the first transistor for fixing a voltage of the emitter of the first transistor, and the voltage of the gate of the MOSFET can be limited. Then, a gate-to-source voltage of the MOSFET is limited, and the maximum of the drain current of the MOSFET is limited to protect the MOSFET. The current limiting circuit has no current limiting resistor mounted on the power transmission route, and therefore power consumption under normal use can be reduced.

Other objectives, advantages and novel features of the invention will become more apparent from the following detailed description when taken in conjunction with the accompanying drawings.

DETAILED DESCRIPTION OF THE INVENTION

Figure 1:
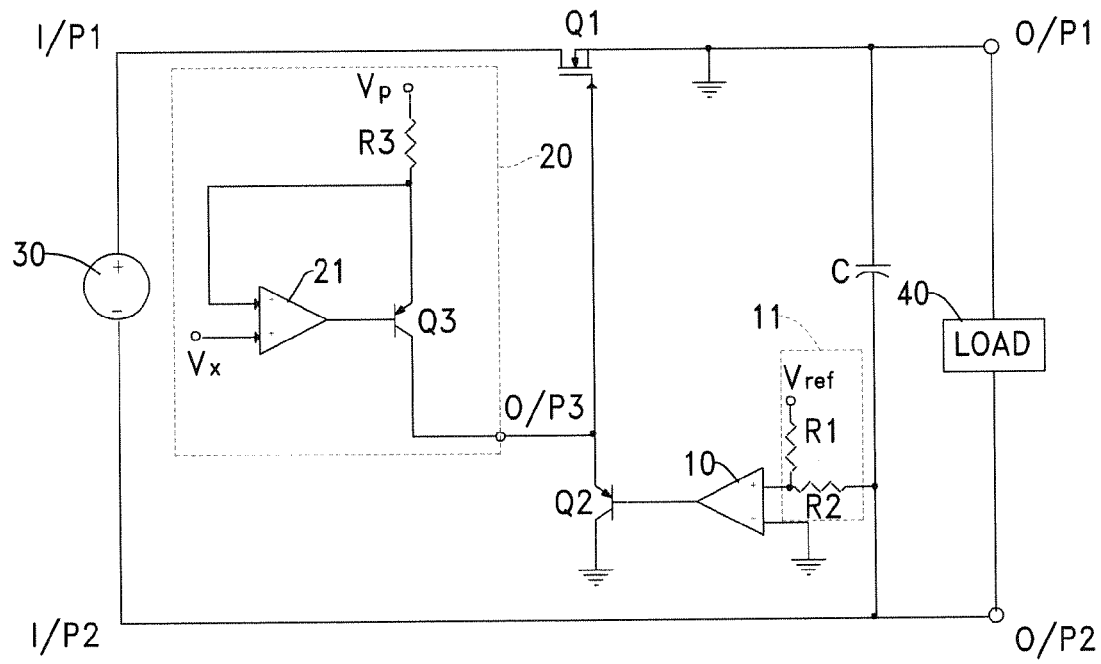
FIG. 1 is an electronic circuit diagram of an embodiment of the present invention.

With reference to FIG. 1, the present invention is a current limiting circuit, and the current limiting circuit has an input positive terminal I/P1, an input negative terminal I/P2, a MOSFET Q1, a first operational amplifier 10, a voltage dividing circuit 11, a voltage-limiting circuit 20, a first transistor Q2, an output positive terminal O/P1, and an output negative terminal O/P2.

The MOSFET Q1 has a drain, a source, and a gate. The drain is electronically connected to the input positive terminal I/P1, and the source is grounded and electronically connected to the output positive terminal O/P1. The input negative terminal I/P2 is electronically connected to the output negative terminal O/P2.

The voltage dividing circuit 11 is electronically connected between a reference voltage source $V_{ref}$ and the output negative terminal O/P2, and comprises a first resistor R1 and a second resistor R2. The first resistor R1 and the second resistor R2 are electronically connected in series.

The first operational amplifier 10 comprises a first positive input, a first negative input, and a first output. The first positive input is electronically connected to a node between the first resistor R1 and the second resistor R2, and the first negative input is grounded.

The voltage-limiting circuit 20 has a fixed-current output O/P3, and the fixed-current output O/P3 is electronically connected to the gate of the MOSFET Q1.

The first transistor Q2 comprises an emitter, a base, and a collector. The emitter is electronically connected to the gate of the MOSFET Q1 and the fixed-current output O/P3 of the voltage-limiting circuit 20, and the base is electronically connected to the first output of the first operational amplifier 10, and the collector is grounded.

When the current limiting circuit is operated, the input positive terminal I/P1 and the input negative terminal I/P2 are electronically connected to a power source 30 for receiving power, and the output positive terminal O/P1 and the output negative terminal O/P2 are electronically connected to a load 40 for providing the load 40 with the electrical power.

Figure 2:
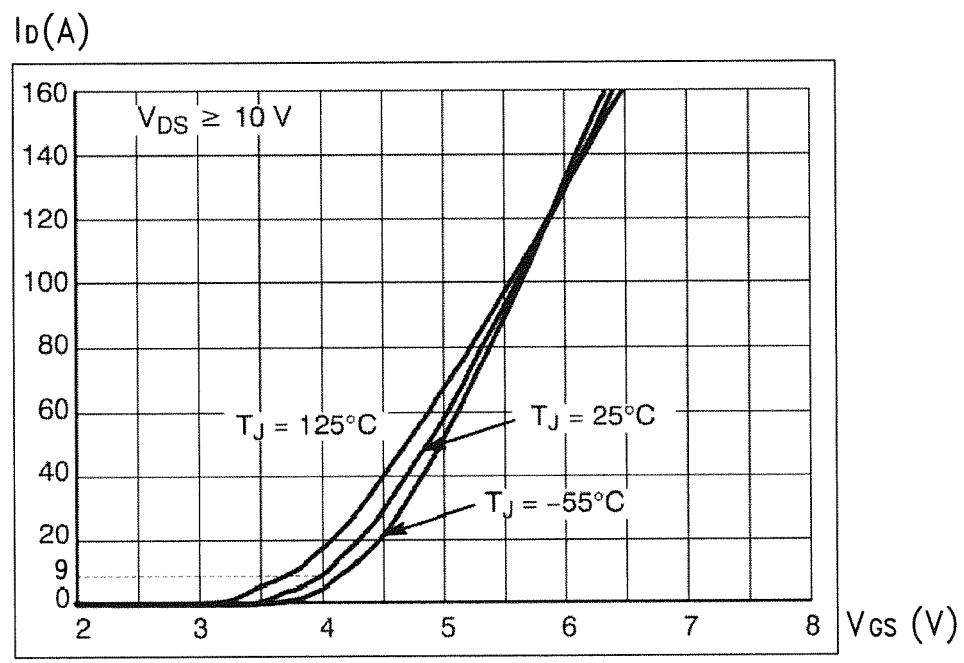
FIG. 2 is a curve chart of a gate-to-source voltage and a maximum drain current of a MOSFET.
Figure 3:
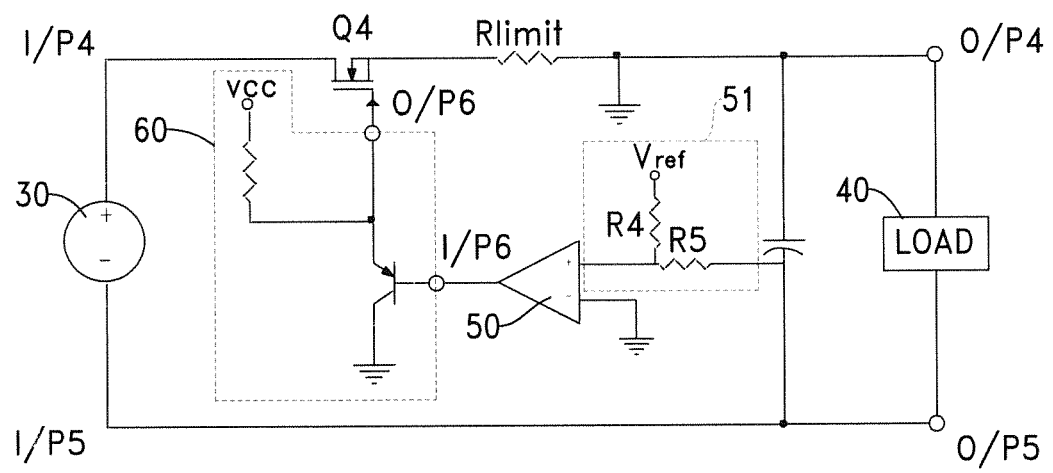
FIG. 3 is an electronic circuit diagram of a conventional current limiting circuit.

Further with reference to FIG. 2, according to a characteristic of the MOSFET Q1, when a gate-to-source voltage ($V_{GS}$) of the MOSFET Q1 exceeds a threshold voltage and is fixed, a maximum of a drain current $I_D$ of the MOSFET Q1 is also limited at a fixed value. The fixed value of the maximum of the drain current $I_D$ is determined by a manufacturing procedure of the MOSFET Q1 and an ambient temperature ($T_J$). For example, when the ambient temperature ($T_J$) is 25° C. and the gate-to-source voltage ($V_{GS}$) is 4 volts, the maximum of the drain current is limited at 9 amperes. The source of the MOSFET Q1 is grounded, and the voltage of the gate of the MOSFET Q1 is limited by the voltage-limiting circuit 20. Then, a gate-to-source voltage of the MOSFET is fixed. Therefore, the drain current can be limited under the maximum of the drain current to protect the MOSFET Q1 from being overloaded.

The current limiting circuit has no current limiting resistor provided at the power transmission route, and therefore power consumption under normal use can be reduced. In the embodiment, the current limiting circuit can be adapted to a low-dropout regulator to be an inner circuit of the low-dropout regulator.

Further, the voltage-limiting circuit 20 comprises a second operational amplifier 21 and a second transistor Q3. The second operational amplifier 21 has a second positive input, a second negative input, and a second output. The second transistor Q3 has an emitter, a base, and a collector.

The second positive input of the second operational amplifier 21 receives a limiting voltage ($V_X$). The second negative input of the second operational amplifier 21 is electronically connected to the emitter of the second transistor Q3, and the second negative input of the second operational amplifier 21 is further electronically connected to receive a positive voltage ($V_P$) through a third resistor R3. The second output of the second operational amplifier 21 is electronically connected to the base of the second transistor Q3.

The collector of the second transistor Q3 is electronically connected to the gate of the MOSFET Q1 to be the fixed-current output O/P3 of the voltage-limiting circuit 20. In the embodiment, the first transistor Q2 and the second transistor Q3 are PNP transistors.

The current limiting circuit further comprises an output capacitor C. The output capacitor C is electronically connected between the output positive terminal O/P1 and the output negative terminal O/P2 to stabilize a voltage between the output positive terminal O/P1 and the output negative terminal O/P2.

According to a characteristic of an imaginary short of an operational amplifier, a voltage of the positive input is equal to a voltage of the negative input. Therefore, a voltage of the second negative input of the second operational amplifier 21 is equal to the limiting voltage ($V_X$), and a voltage of the emitter of the second transistor Q3 is also equal to the limiting voltage ($V_X$). Then, an emitter current $I_E$ of the second transistor Q3 can be determined by the Ohm's Law.

$$I_E = \frac{V_p - V_x}{R3}$$

When the positive voltage ($V_P$) and the limiting voltage ($V_X$) are fixed, the emitter current $I_E$ is also fixed, and the fixed-current output O/P3 of the voltage-limiting circuit 20 outputs a fixed current.

Because the voltage of the emitter of the second transistor Q3 is equal to the limiting voltage ($V_X$), the voltage of the emitter of the first transistor Q2 and the voltage of the gate of the MOSFET Q1 are smaller than the limiting voltage $V_X$. Further, the source of the MOSFET Q1 is grounded, and the gate-to-source voltage ($V_{GS}$) is smaller than the limiting voltage ($V_X$). Therefore, the drain current of the MOSFET Q1 can be limited when the gate-to-source voltage ($V_{GS}$) of the MOSFET is limited under the limiting voltage ($V_X$).

The voltage-limiting circuit 20 fixes the voltage of the gate of the MOSFET Q1, and then limits the maximum of the drain current of the MOSFET Q1. Therefore, the MOSFET Q1 can be protected by the voltage-limiting circuit 20 from being overloaded.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A current limiting circuit for electronically connecting between a power source and a load, and comprising:
    an input positive terminal and an input negative terminal, wherein the input positive terminal and the input negative terminal are adapted to electronically connect to the power source;
    a MOSFET having a drain, a source, and a gate, wherein the drain is electronically connected to the input positive terminal, and the source is grounded;
    an output positive terminal and an output negative terminal, wherein the output positive terminal and the output negative terminal are adapted to electronically connect to the load;
    a voltage dividing circuit electronically connected between a reference voltage source and the output negative terminal, and having a first resistor and a second resistor, wherein the first resistor and the second resistor are electronically connected in series;
    a first operational amplifier having a first positive input, a first negative input, and a first output, wherein the first positive input is electronically connected to a node between the first resistor and the second resistor, and the first negative input is grounded;
    a voltage-limiting circuit having a fixed-current output, wherein the fixed-current output is electronically connected to the gate of the MOSFET; and
    a first transistor having an emitter, a base, and a collector, wherein the emitter is electronically connected to the gate of the MOSFET, the base is electronically connected to the first output of the first operational amplifier, and the collector is grounded;
wherein the voltage-limiting circuit comprises:
    a second operational amplifier having a second positive input, a second negative input, and a second output;
    wherein the second positive input receives a limiting voltage, and the second negative input is electronically connected to receive a positive voltage through a third resistor; and
    a second transistor having an emitter, a base, and a collector;
    wherein the emitter of the second transistor is electronically connected to the second negative input of the second operational amplifier, the base of the second transistor is electronically connected to the second output of the second operational amplifier, and the collector of the second transistor is electronically connected to the gate of the MOSFET to be the fixed-current output of the voltage-limiting circuit.

2. The current limiting circuit as claimed in claim 1, further comprising:
    an output capacitor electronically connected between the output positive terminal and the output negative terminal.

* * * * *